(12) United States Patent
Huang et al.

(10) Patent No.: US 12,362,196 B2
(45) Date of Patent: Jul. 15, 2025

(54) PACKAGE STRUCTURE WITH UNDERFILL

(71) Applicant: TAIWAN SEMICONDUCTOR MANUFACTURING COMPANY, LTD., Hsinchu (TW)

(72) Inventors: Kuan-Yu Huang, Taipei (TW); Sung-Hui Huang, Dongshan Township, Yilan County (TW); Jui-Hsieh Lai, Taoyuan (TW); Shang-Yun Hou, Jubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 116 days.

(21) Appl. No.: 17/737,306

(22) Filed: May 5, 2022

(65) Prior Publication Data

US 2022/0270894 A1    Aug. 25, 2022

Related U.S. Application Data

(62) Division of application No. 16/510,474, filed on Jul. 12, 2019, now Pat. No. 11,328,936.

(Continued)

(51) Int. Cl.
*H01L 21/48* (2006.01)
*H01L 21/56* (2006.01)
(Continued)

(52) U.S. Cl.
CPC ........ *H01L 21/563* (2013.01); *H01L 21/4853* (2013.01); *H01L 21/4867* (2013.01); *H01L 23/3185* (2013.01); *H01L 23/5386* (2013.01); *H01L 23/562* (2013.01); *H01L 24/16* (2013.01); *H01L 24/81* (2013.01);
(Continued)

(58) Field of Classification Search
CPC ............... H01L 21/563; H01L 21/4853; H01L 21/4867; H01L 23/3185; H01L 23/5386; H01L 23/562; H01L 24/16; H01L 24/81; H01L 25/0655; H01L 2224/16225;
(Continued)

(56) References Cited

U.S. PATENT DOCUMENTS 5,540,379 A   7/1996   Kazem-Goudarzi et al.
7,038,321 B1  5/2006   Chavan et al.
(Continued)

FOREIGN PATENT DOCUMENTS

JP   2006-140327 A   6/2006
JP   2007-243106 A   9/2007

*Primary Examiner* — Benjamin Tzu-Hung Liu
(74) *Attorney, Agent, or Firm* — Birch, Stewart, Kolasch & Birch, LLP

(57) ABSTRACT

A package structure is provided. The package structure includes a semiconductor die structure over a substrate and bonding structures between the semiconductor die and the substrate. The package structure also includes multiple solder elements over the substrate. The solder elements together surround the semiconductor die structure, and each of the solder elements is longer than a side of the semiconductor die structure. The package structure further includes an underfill material surrounding the bonding structures. The underfill material is substantially confined within a region surrounded by the solder elements. The underfill material is in direct contact with at least one of the solder elements.

20 Claims, 24 Drawing Sheets

Related U.S. Application Data

(60) Provisional application No. 62/783,415, filed on Dec. 21, 2018.

(51) Int. Cl.
  *H01L 23/00* (2006.01)
  *H01L 23/31* (2006.01)
  *H01L 23/538* (2006.01)
  *H01L 25/065* (2023.01)

(52) U.S. Cl.
  CPC  *H01L 25/0655* (2013.01); *H01L 2224/16225* (2013.01); *H01L 2224/81815* (2013.01); *H01L 2924/18161* (2013.01); *H01L 2924/3511* (2013.01)

(58) Field of Classification Search
  CPC . H01L 2224/81815; H01L 2924/18161; H01L 2924/3511
  See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,426,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,497,861 B2 | 11/2016 | Lu et al. | |
| 9,666,502 B2 | 5/2017 | Chen et al. | |
| 9,735,131 B2 | 8/2017 | Su et al. | |
| 10,529,637 B1* | 1/2020 | Yu | H01L 25/50 |
| 2004/0244613 A1 | 12/2004 | Barajas et al. | |
| 2008/0149369 A1 | 6/2008 | Kawamura et al. | |
| 2011/0147912 A1* | 6/2011 | Karpur | H01L 21/563 |
| | | | 257/E23.129 |
| 2012/0049355 A1 | 3/2012 | Hosokawa et al. | |
| 2012/0083073 A1* | 4/2012 | Tanuma | H01L 23/49838 |
| | | | 257/E21.505 |
| 2012/0159118 A1 | 6/2012 | Wong et al. | |
| 2013/0284796 A1 | 10/2013 | Nagar et al. | |
| 2014/0061893 A1 | 3/2014 | Saeidi et al. | |
| 2014/0103536 A1* | 4/2014 | Yokoyama | H01L 24/06 |
| | | | 257/773 |
| 2015/0262900 A1* | 9/2015 | Wang | H01L 23/42 |
| | | | 438/126 |
| 2016/0358834 A1 | 12/2016 | Xu | |
| 2017/0047261 A1* | 2/2017 | Lu | H01L 25/105 |
| 2018/0366439 A1 | 12/2018 | Lin et al. | |
| 2019/0139786 A1 | 5/2019 | Yeh | |
| 2021/0111088 A1* | 4/2021 | Jain | H01L 23/49816 |

\* cited by examiner

PACKAGE STRUCTURE WITH UNDERFILL

PRIORITY CLAIM AND CROSS-REFERENCE

This Application is a Divisional of U.S. application Ser. No. 16/510,474, filed on Jul. 12, 2019, which claims the benefit of U.S. Provisional Application No. 62/783,415, filed on Dec. 21, 2018, the entirety of which are incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
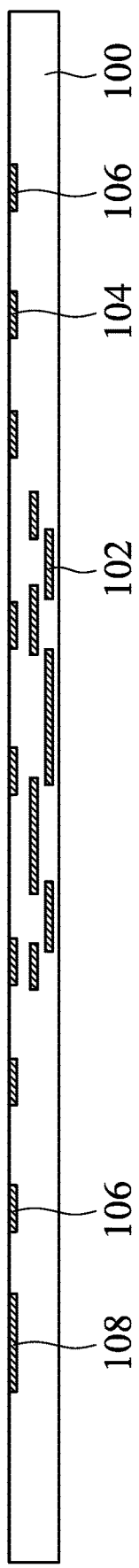
FIGS. 1A-1I are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1I are cross-sectional views of various stages of a process for forming a package structure, in accordance with some embodiments. As shown in FIG. 1A, a substrate 100 is received or provided. The substrate 100 may be made of or include a polymer material, a semiconductor material, a ceramic material, one or more other suitable materials, or a combination thereof. In some embodiments, the substrate 100 includes a polymer-containing board with multiple conductive features 102 formed therein and/or thereon. The conductive features 102 may include conductive lines, conductive vias, conductive pads, one or more other suitable conductive elements, or a combination thereof. The conductive features 102 may be used to form electrical connections between a semiconductor die structure to be disposed onto the front side of substrate 100 and other device elements to be disposed onto the back side of the substrate 100.

In some embodiments, conductive elements 104, 106, and 108 are formed at the front side of the substrate 100, as shown in FIG. 1A. In some embodiments, the conductive elements 104 function as conductive pads. The conductive elements 104 may be used to receive bonding structures of a semiconductor die structure to be disposed onto the substrate 100. In some embodiments, the conductive element 108 is used to receive a device element such as a surface mounted device.

In some embodiments, the conductive elements 106 are separated from each other and together form a ring-like structure that surrounds the conductive elements 104. In some other embodiments, the conductive element 106 is a single ring structure that surrounds the conductive elements 104.

Figure 1B:
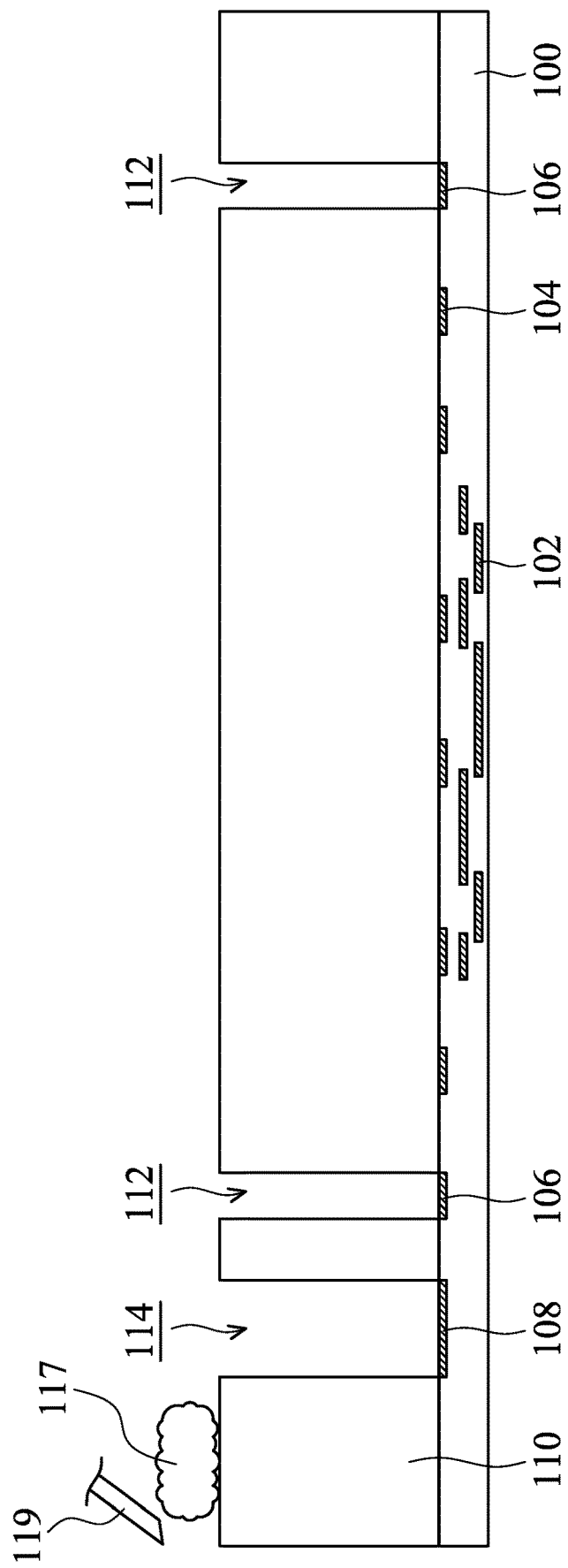

As shown in FIG. 1B, a stencil 110 is disposed over the substrate 100, in accordance with some embodiments. In some embodiments, the stencil 110 includes one or more openings 112. The openings 112 completely penetrate through the stencil 110. The openings 112 partially expose the substrate 100, as shown in FIG. 1B. In some embodiments, the openings 112 expose the conductive elements 106 formed at the front side of the substrate 100. In some embodiments, the stencil further includes an opening 114 that exposes the conductive element 108.

The stencil 110 may be made of or include steel, aluminum, copper, silicon, gold, one or more other suitable materials, or a combination thereof. The openings 112 and 114 may be formed using a mechanical drilling process, an energy beam drilling process, photolithography and etching processes, one or more other applicable processes, or a combination thereof.

As shown in FIG. 1B, a paste material 117 is provided on the stencil 110, in accordance with some embodiments. In some embodiments, a squeegee 119 is provided for extending the paste material 117 over the stencil. As a result, a portion of the paste material 117 may be introduced into the openings 112 and 114 of the stencil 110.

In some embodiments, the paste material 117 is a conductive paste. In some embodiments, the paste material 117 is a solder paste. The solder paste may include solder powder and flux medium. In some embodiments, the solder paste is a tin-containing solder paste. The tin-containing solder paste may further include copper, silver, gold, aluminum, lead, one or more other suitable materials, or a combination thereof. In some embodiments, the tin-containing solder paste is lead free.

Figure 1C:
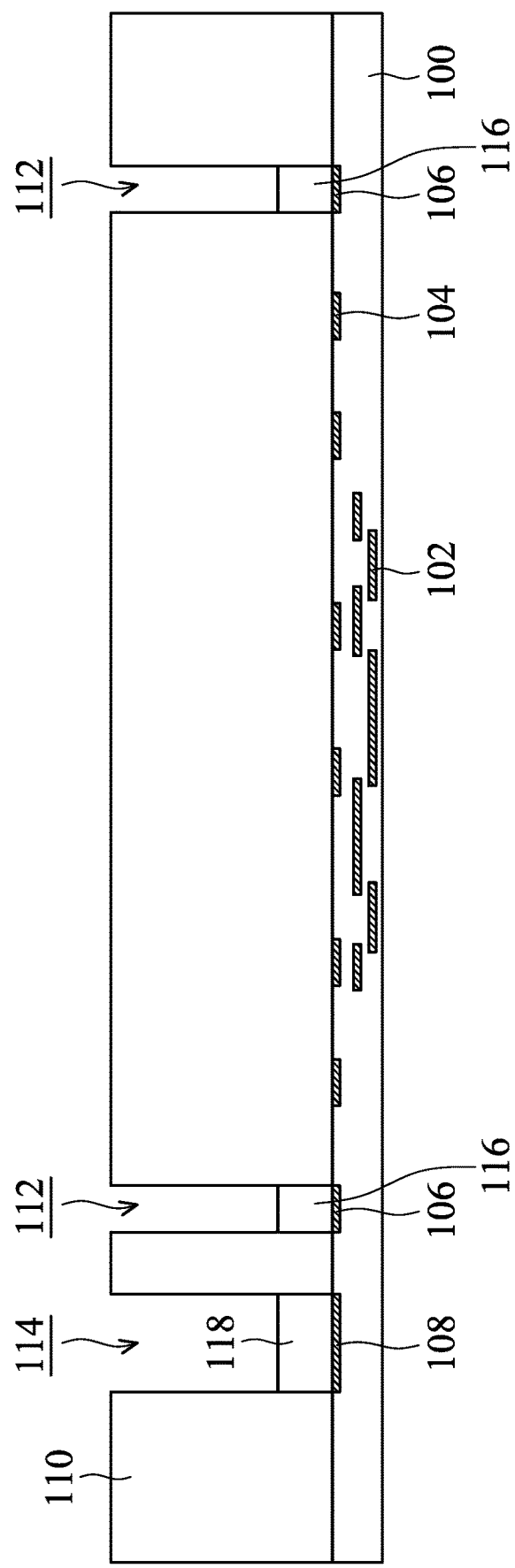

After the squeezing of the squeegee 119, portions of the paste material 117 are disposed over (or squeezed onto) the substrate 100 through the openings 112 and 114 to form solder elements 116 and 118, as shown in FIG. 1C in accordance with some embodiments. In some embodiments, the solder elements 116 and 118 are formed simultaneously. However, many variations and/or modifications can be made to embodiments of the disclosure. In some other embodiments, the solder elements 116 and 118 are separately formed. In some embodiments, the solder elements 116 are in direct contact with the conductive elements 106. In some embodiments, the solder element 118 is in direct contact with the conductive element 108.

Figure 2A:
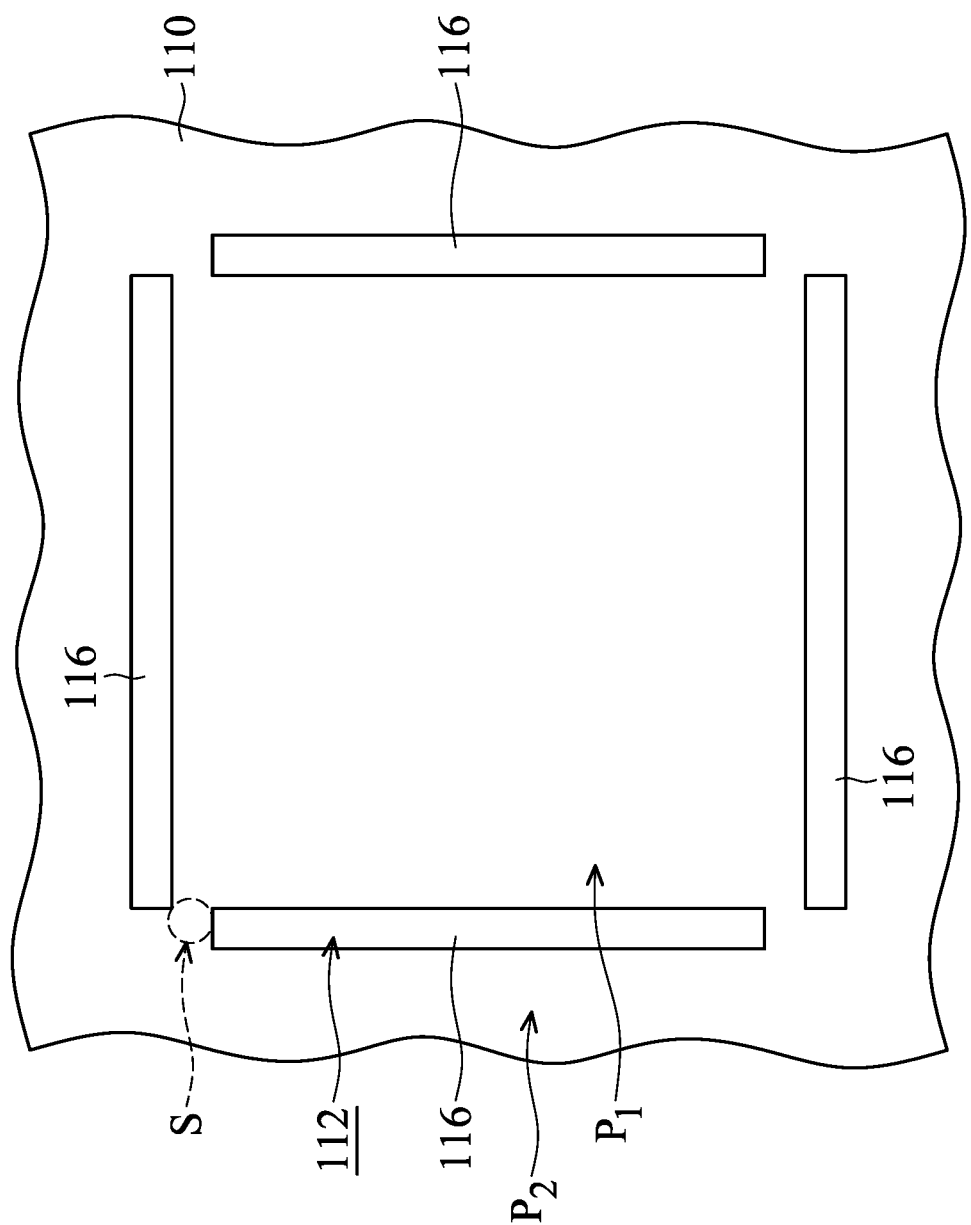
FIGS. 2A-2C are top views of various stages of a process for forming a package structure, in accordance with some embodiments.
Figure 2B:
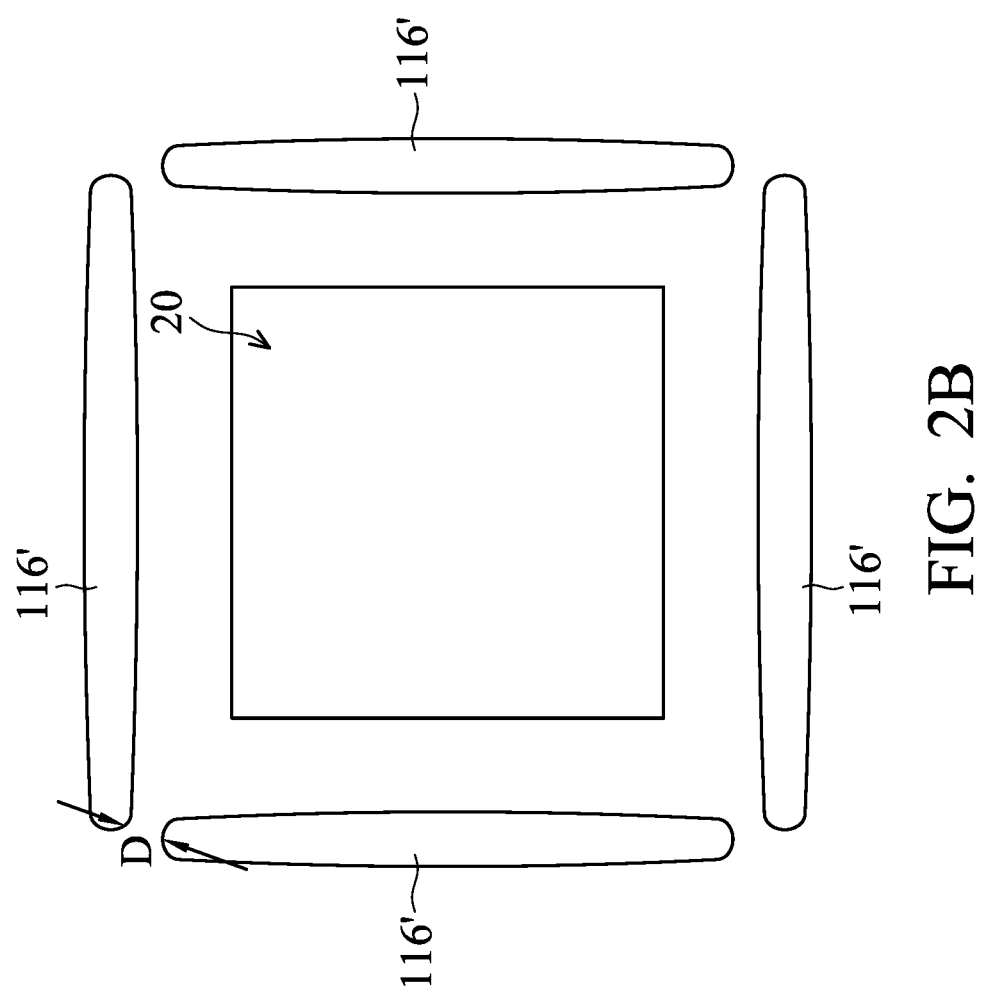
Figure 2C:
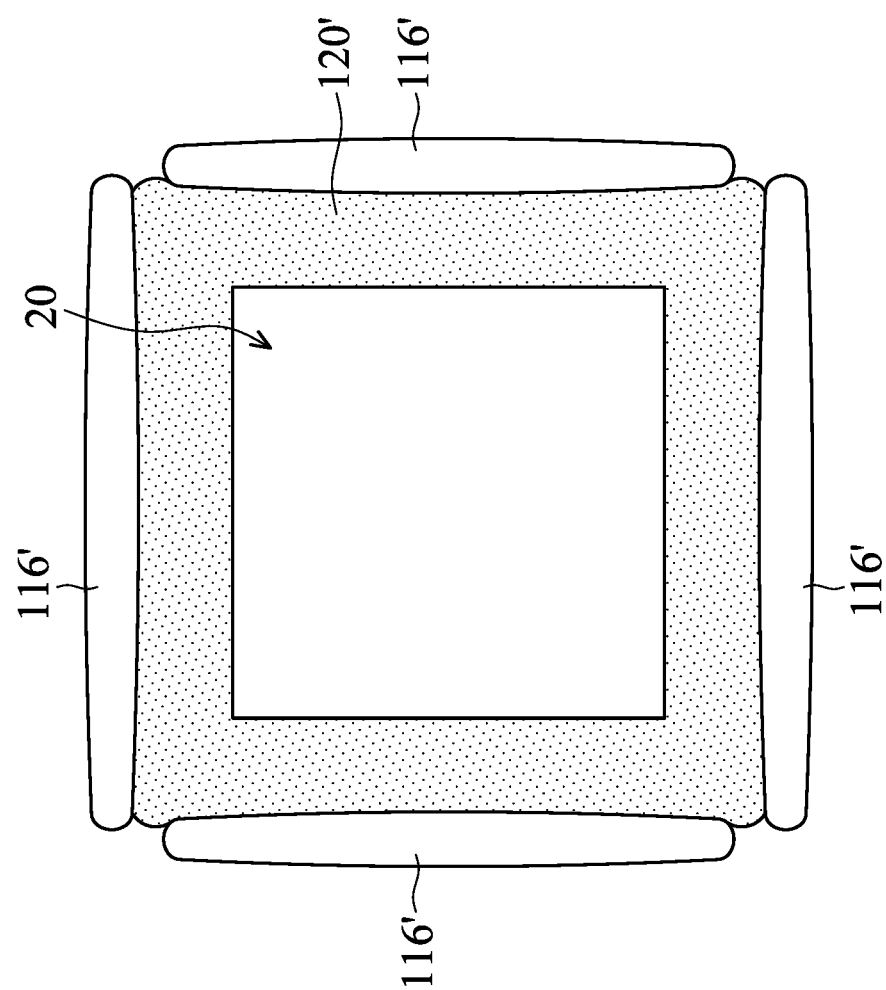

FIGS. 2A-2C are top views of various stages of a process for forming a package structure, in accordance with some embodiments. In some embodiments, FIG. 2A shows the top view of a portion of the structure shown in FIG. 1C.

As shown in FIG. 2A, the solder elements 116 are formed in the openings 112 of the stencil 110, in accordance with some embodiments. The solder elements 116 together surround a region where a semiconductor die structure will be placed.

As shown in FIG. 2A, the stencil 110 has an inner portion $P_1$ that is surrounded by the openings 112 and an outer portion $P_2$ that surrounds the inner portion $P_1$, in accordance with some embodiments. In some embodiments, the stencil 110 includes a support portion S that links the inner portion $P_1$ and the outer portion $P_2$. Due to the support of the support portion S, the inner portion $P_1$ and the outer portion $P_2$ are linked as a single piece, which makes the process easier to perform.

Figure 1D:
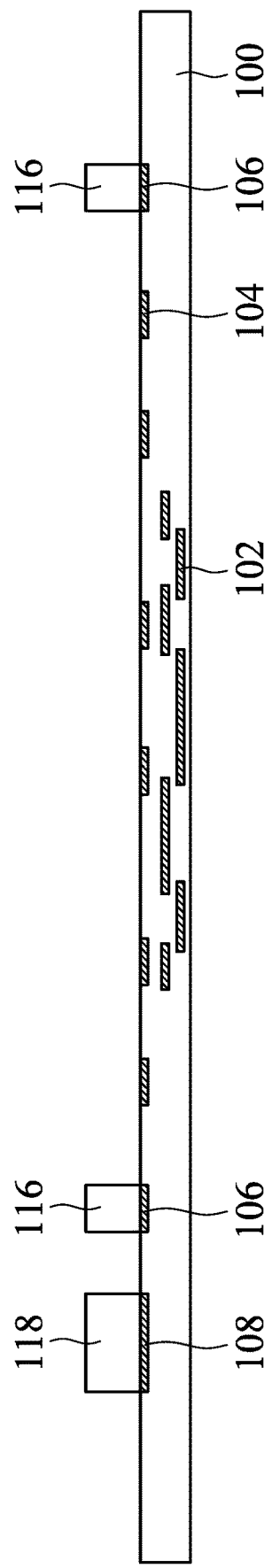

Afterwards, the stencil 110 is removed, as shown in FIG. 1D in accordance with some embodiments. The solder elements 116 and 118 remain over the conductive elements 106 and 108, respectively.

Figure 1E:
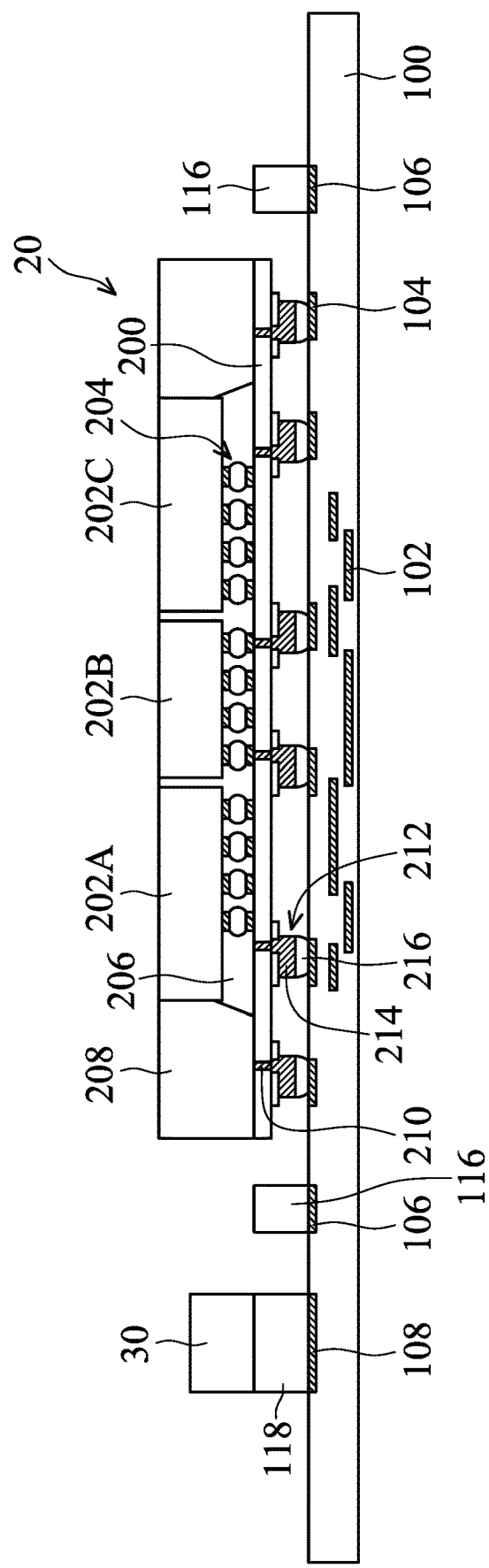

As shown in FIG. 1E, a semiconductor die structure 20 is disposed over the region of the substrate 100 that is surrounded by the solder elements 116, in accordance with some embodiments. In some embodiments, the semiconductor die structure 20 includes a single semiconductor die. In some embodiments, the semiconductor die structure 20 is a die package having a single semiconductor die. In some embodiments, the semiconductor die structure 20 includes multiple semiconductor dies. In some embodiments, the semiconductor die structure 20 is a die package having multiple semiconductor dies. In some embodiments, the semiconductor die structure 20 includes a stack of multiple semiconductor dies. In some embodiments, some or all of the semiconductor dies are laterally disposed over a substrate.

As shown in FIG. 1E, the semiconductor die structure 20 includes semiconductor dies 202A, 202B, and 202C that are disposed over a substrate 200, in accordance with some embodiments. The substrate 200 may be made of or include a semiconductor material, a ceramic material, one or more other suitable materials, or a combination thereof. In some embodiments, the substrate 200 is a semiconductor wafer such as a silicon wafer. In some other embodiments, the substrate 200 is a glass wafer. In some other embodiments, the substrate 200 is a polymer-containing substrate with a profile similar to a silicon wafer.

In some embodiments, the semiconductor dies 202A, 202B, and 202C are bonded onto the substrate 200 through bonding structures 204, as shown in FIG. 1E. The bonding structures 204 may include conductive pillars, solder elements, one or more other suitable elements, or a combination thereof. In some embodiments, each of the solder elements is stacked with two of the conductive pillars. For example, each of the solder elements is positioned between two of the conductive pillars, as shown in FIG. 1E.

In some embodiments, the conductive pillars are metal pillars. The metal pillars may be made of or include copper, aluminum, titanium, cobalt, gold, platinum, one or more other suitable materials, or a combination thereof. In some embodiments, the solder elements are tin-containing solder elements. The tin-containing solder elements may further include copper, silver, gold, aluminum, lead, one or more other suitable materials, or a combination thereof. In some embodiments, the tin-containing solder elements are lead free. The formation of the bonding structures 204 may involve one or more reflow processes and/or one or more plating processes.

In some embodiments, multiple conductive features are formed in and/or on the substrate 200. These conductive features may include conductive lines, conductive pads, conductive vias, one or more other suitable conductive elements, or a combination thereof. In some embodiments, multiple through substrate vias 210 are formed in the substrate 200. The through substrate vias 210 may form electrical connections between elements disposed over opposite surfaces of the substrate 200.

In some embodiments, an underfill material 206 is formed over the substrate 200 to surround the bonding structures 204, as shown in FIG. 1E. The underfill material 206 may be used to protect the bonding structures 204. The underfill material 206 may be made of or include one or more polymer materials. The underfill material 206 may include an epoxy-based resin. In some embodiments, the underfill material 206 further includes fillers that are dispersed in the epoxy-based resin. The fillers may include fibers (such as silica fibers), particles (such as silica particles), one or more other suitable elements, or a combination thereof.

In some embodiments, the formation of the underfill material 206 involves an injecting process, a dispensing process, a film lamination process, an application process, one or more other applicable processes, or a combination thereof. In some embodiments, a thermal curing process is then used to complete the formation of the underfill material 206.

As shown in FIG. 1E, a protective layer 208 is formed to surround the semiconductor dies 202A, 202B, and 202C, in accordance with some embodiments. The protective layer 208 also surrounds the underfill material 206 and the bonding structures 204. In some embodiments, the protective layer 208 is in direct contact with the semiconductor dies 202A, 202B, and 202C.

In some embodiments, the protective layer 208 is made of or includes a molding compound material. The molding compound material may include a polymer material, such as an epoxy-based resin with fillers dispersed therein. In some embodiments, a liquid molding compound material is introduced or injected over the substrate 200. A thermal process may then be used to cure the liquid molding compound material and to transform it into the protective layer 208.

As shown in FIG. 1E, the semiconductor die structure 20 is bonded onto the conductive elements 104 through bonding structures 212, in accordance with some embodiments. The bonding structures 212 may also form electrical connections between the conductive features 102 in the substrate 100 and the semiconductor dies 202A, 202B, and/or 202C in the semiconductor die structure 20. In some embodiments, the bonding structures 212 include conductive pillars 214 and solder bumps 216, as shown in FIG. 1E.

In some embodiments, the conductive pillars 214 are metal pillars. The metal pillars may be made of or include copper, aluminum, titanium, cobalt, gold, platinum, one or more other suitable materials, or a combination thereof. In some embodiments, the solder bumps 216 are tin-containing solder bumps. The tin-containing solder bumps may further include copper, silver, gold, aluminum, lead, one or more other suitable materials, or a combination thereof. In some embodiments, the solder bumps 216 contain tin and are lead free. The formation of the bonding structures 212 may involve one or more reflow processes and/or one or more plating processes.

As shown in FIG. 1E, a surface mounted device 30 is bonded onto the substrate 100 through the solder element 118, in accordance with some embodiments. In some embodiments, the surface mounted device 30 is positioned outside of the region surrounded by the solder elements 116, as shown in FIG. 1E. The surface mounted device 30 may include one or more passive elements such as resistors, capacitors, inductors, one or more other suitable elements, or a combination thereof. In some other embodiments, the surface mounted device 30 includes memory devices.

Figure 1F:
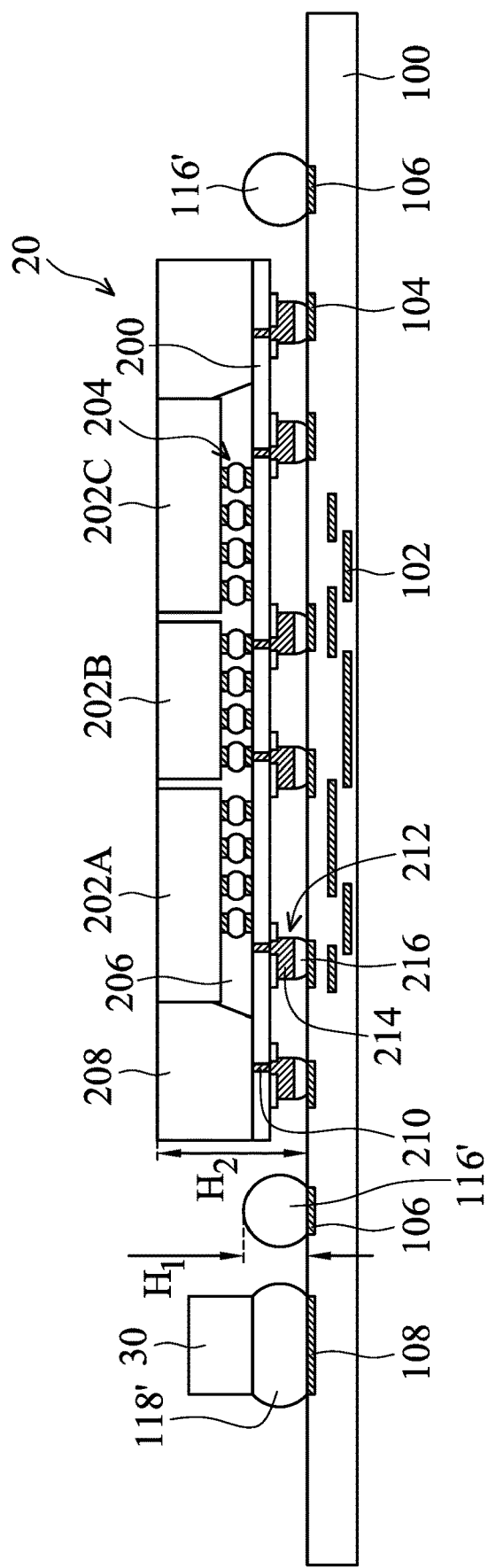

As shown in FIG. 1F, the solder elements 116 and 118 are reflowed to form reflowed solder elements 116' and 118', in accordance with some embodiments. In some embodiments, during the reflow process for forming the reflowed solder elements 116' and 118', the solder bumps 216 of the bonding structures 212 are also simultaneously reflowed. After the reflow process, the bonding between the solder bumps 216 and the conductive elements 104 are enhanced.

In some embodiments, FIG. 2B shows the top view of a portion of the structure shown in FIG. 1F. In some embodiments, as shown in FIGS. 1F and/or 2B, the reflowed solder elements 116' and 118' have more rounded profiles than the solder elements 116 and 118. In some embodiments, one of the reflowed solder elements 116' extends along a direction that is substantially parallel to an extending direction of a side of the semiconductor die structure 20, as shown in FIG. 2B.

However, embodiments of the disclosure are not limited thereto. Many variations and/or modifications can be made to embodiments of the disclosure. In some other embodiments, the solder elements 116 and 118 are not reflowed.

In some embodiments, the reflowed solder elements 116' together surround the region where the semiconductor die structure 20 is positioned, as shown in FIG. 2B. In some embodiments, these reflowed solder elements 116' are separated from each other. In some embodiments, two of the nearby reflowed solder elements 116' are separated from each other by a distance D, as shown in FIG. 2B. The distance D may be varied according to the requirement. For example, through designing the size and/or profile of the support portion S of the stencil 110 in FIG. 2A, the distance D in FIG. 2B may be varied.

Referring back to FIG. 1F, one of the reflowed solder elements 116' has a height $H_1$, and the semiconductor die structure 20 has a height $H_2$. In some embodiments, the height $H_2$ is greater than the height $H_1$. Due to the assistance of the stencil 110, the reflowed solder elements 116' are allowed to be formed with a greater height. The height $H_1$ may be in a range from about 80 µm to about 100 µm. The height ratio ($H_1/H_2$) of the height $H_1$ to the height $H_2$ may be in a range from about ⅕ to about ¾.

Figure 1G:
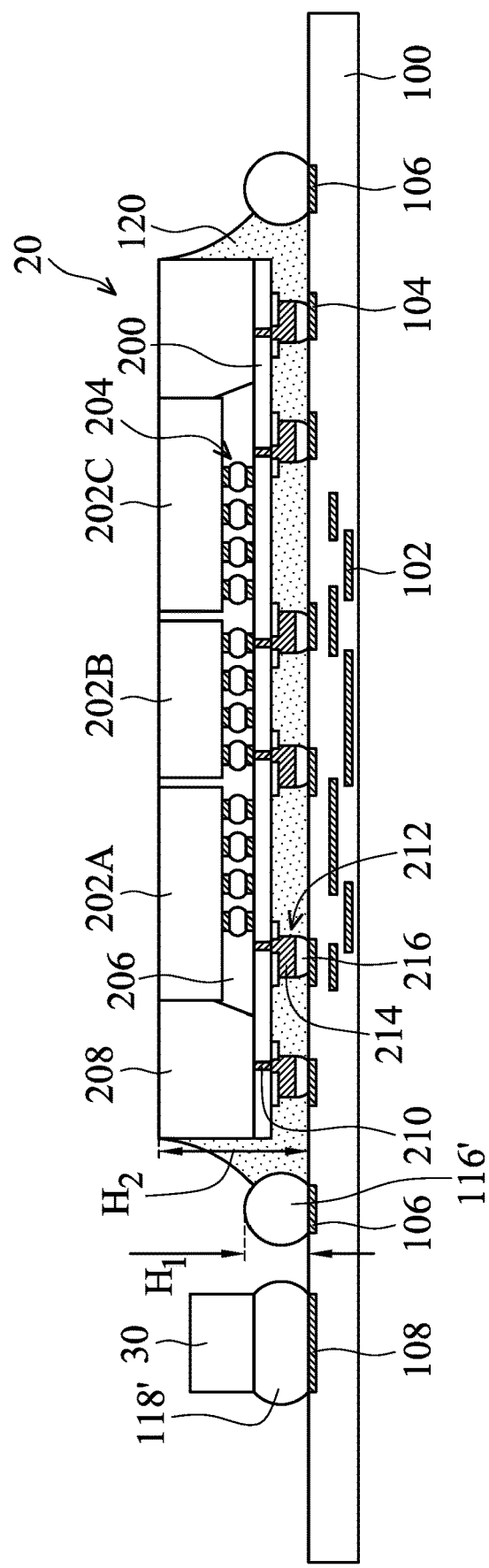

As shown in FIG. 1G, an underfill material 120 is dispensed and/or introduced onto the region that is surrounded by the reflowed solder elements 116', in accordance with some embodiments. In some embodiments, the underfill material 120 is a polymer-containing liquid. The underfill material 120 may be made of or include an epoxy-based resin. In some embodiments, the underfill material 120 further includes fillers that are dispersed in the epoxy-based resin. The fillers may include fibers (such as silica fibers), particles (such as silica particles), one or more other suitable elements, or a combination thereof.

In some embodiments, the protective layer 208 has a greater weight percentage of fillers than the weight percentage of fillers of the underfill material 120. In some embodiments, the fillers in the protective layer 208 have a greater average size than the fillers in the underfill material 120.

The reflowed solder elements 116' may be used to confine the underfill material 120 to being substantially inside the region that is surrounded by the reflowed solder elements 116'. The reflowed solder elements 116' may substantially prevent the underfill material 120 from flowing outside of the region that is surrounded by the reflowed solder elements 116'. Due to the confinement of the reflowed solder elements 116', the underfill material 120 is prevented from reaching the surface mounted device 30. Therefore, the quality and reliability of the surface mounted device 30 are ensured. Due to the reflowed solder elements 116', the underfill material 120 may be limited in a predetermined region and be prevented from occupying too much area of the substrate 100. Therefore, more device elements are allowed to be integrated onto the substrate 100.

Figure 1H:
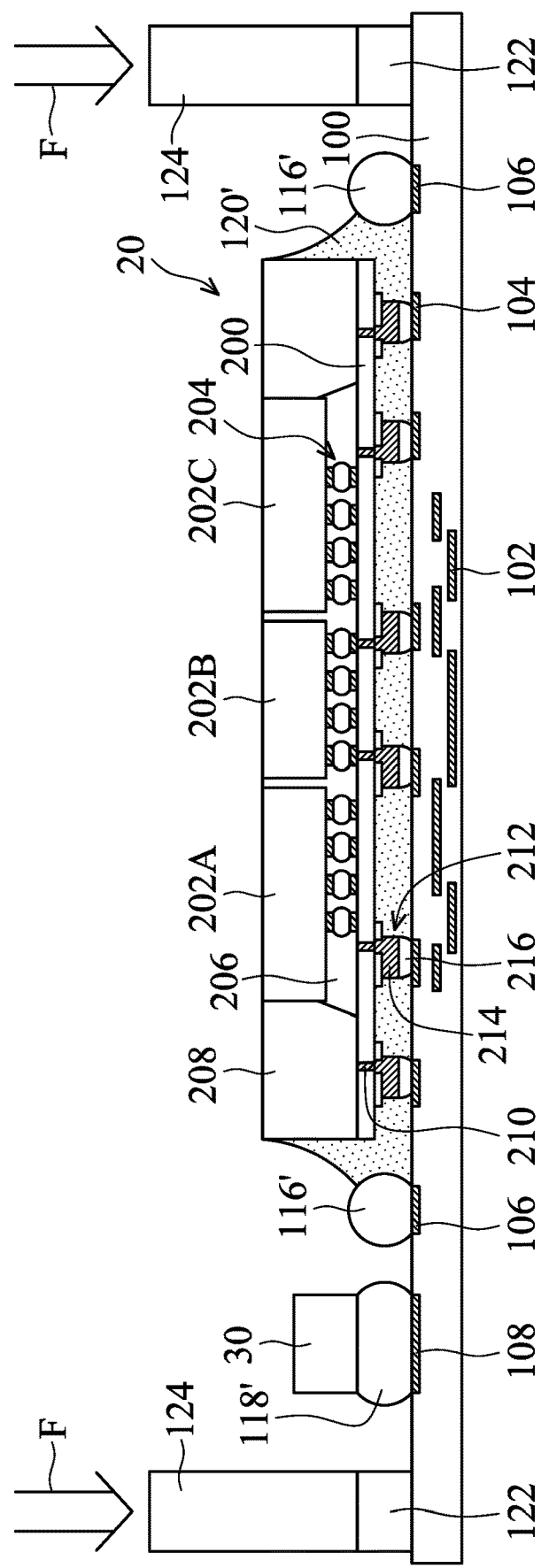

As shown in FIG. 1H, the underfill material 120 is cured to form a cured underfill material 120', in accordance with some embodiments. The curing process may be performed using a thermal operation, a light irradiation operation (such as UV-light irradiation and/or an IR-light irradiation), one or more other applicable operations, or a combination thereof.

In some embodiments, FIG. 2C shows the top view of a portion of the structure shown in FIG. 1H. As shown in FIG. 2C, the cured underfill material 120' is substantially confined and/or blocked within the region that is surrounded by the reflowed solder elements 116', in accordance with some embodiments. In some embodiments, the cured underfill material 120' is in direct contact with the reflowed solder elements 116', as shown in FIG. 2C.

Afterwards, an anti-warpage element 124 is disposed over the substrate 100 after curing the underfill material 120 for forming the cured underfill material 120', as shown in FIG. 1H in accordance with some embodiments. In some embodiments, the anti-warpage element 124 is an anti-warpage ring that surrounds the reflowed solder elements 116' and the surface mounted device 30.

After the thermal operations for reflowing the solder elements and curing the underfill material 120, the substrate 100 may warp due to different thermal expansion coefficients of different materials. The anti-warpage element 124 may help to reduce the degree of warpage of the substrate 100, which facilitates following processes.

In some embodiments, the anti-warpage element 124 is attached onto the substrate 100, as shown in FIG. 1H. In some embodiments, the anti-warpage element 124 is attached using an adhesive layer 122. In some embodiments, during the attaching of the anti-warpage element 124, an external force F is applied to the anti-warpage element 124. As a result, the degree of warpage of the substrate 100 may be reduced.

Figure 1I:
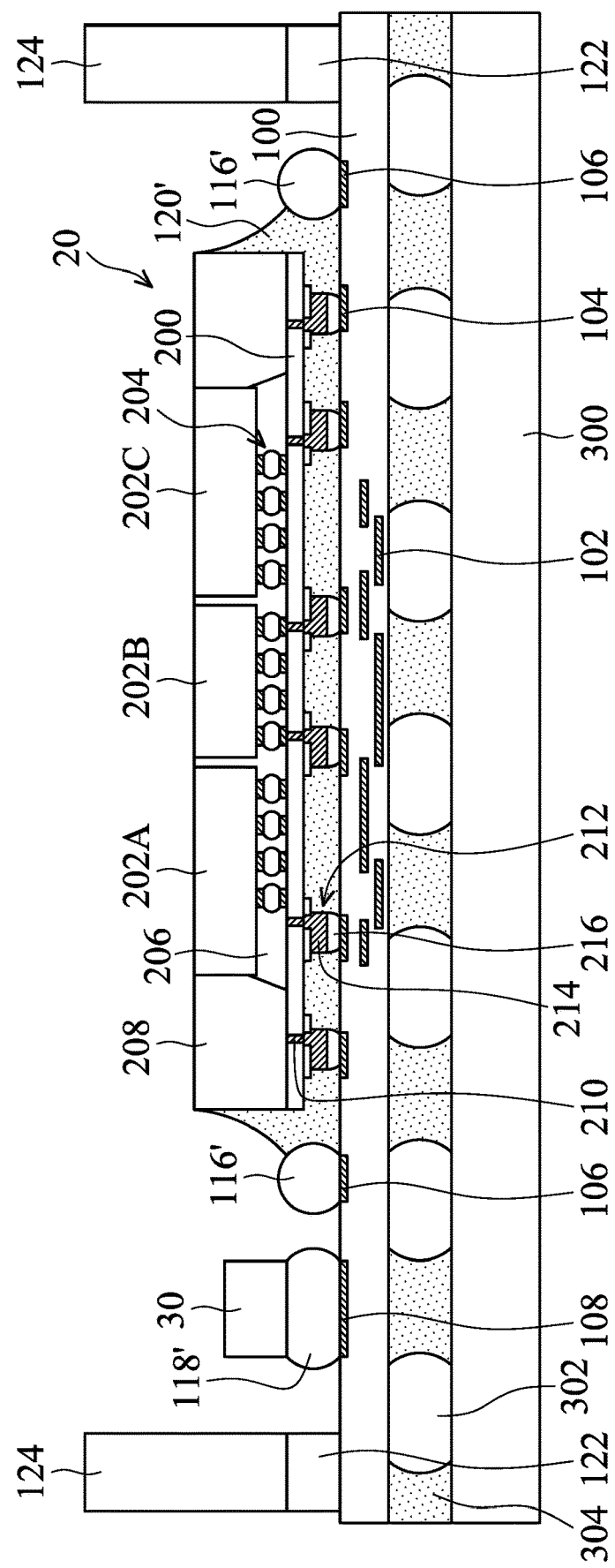

As shown in FIG. 1I, the structure shown in FIG. 1H is bonded onto a substrate 300 through bonding structures 302, in accordance with some embodiments. In some embodiments, the substrate 300 is a printed circuit board. Due to the anti-warpage element 124, the bonding between the structure shown in FIG. 1I1 and the substrate 300 may be easier since the degree of warpage of the substrate 100 is reduced.

In some embodiments, the bonding structures 302 include solder bumps, metal pillars, one or more other suitable conductive elements, or a combination thereof. In some embodiments, an underfill material 304 is formed between the substrates 300 and 100, as shown in FIG. 1I. The underfill material 304 may be used to protect the bonding structures 302.

However, embodiments of the disclosure are not limited thereto. Many variations and/or modifications can be made to embodiments of the disclosure. In some other embodiments, the paste material 117 is an insulating material. In these cases, the elements surrounding the region where the semiconductor die structure 20 is placed are insulating elements. In these cases, the reference number "116" is used to designate insulating elements. The insulating elements 116 may also be used to prevent the underfill material 120 from flowing outside of the region surrounded by the insulating elements 116. Since the underfill material 120 is confined and/or constrained within the region, a larger available region of the substrate 100 may be obtained. Therefore, more device elements are allowed to be integrated onto the substrate 100.

Figure 3A:
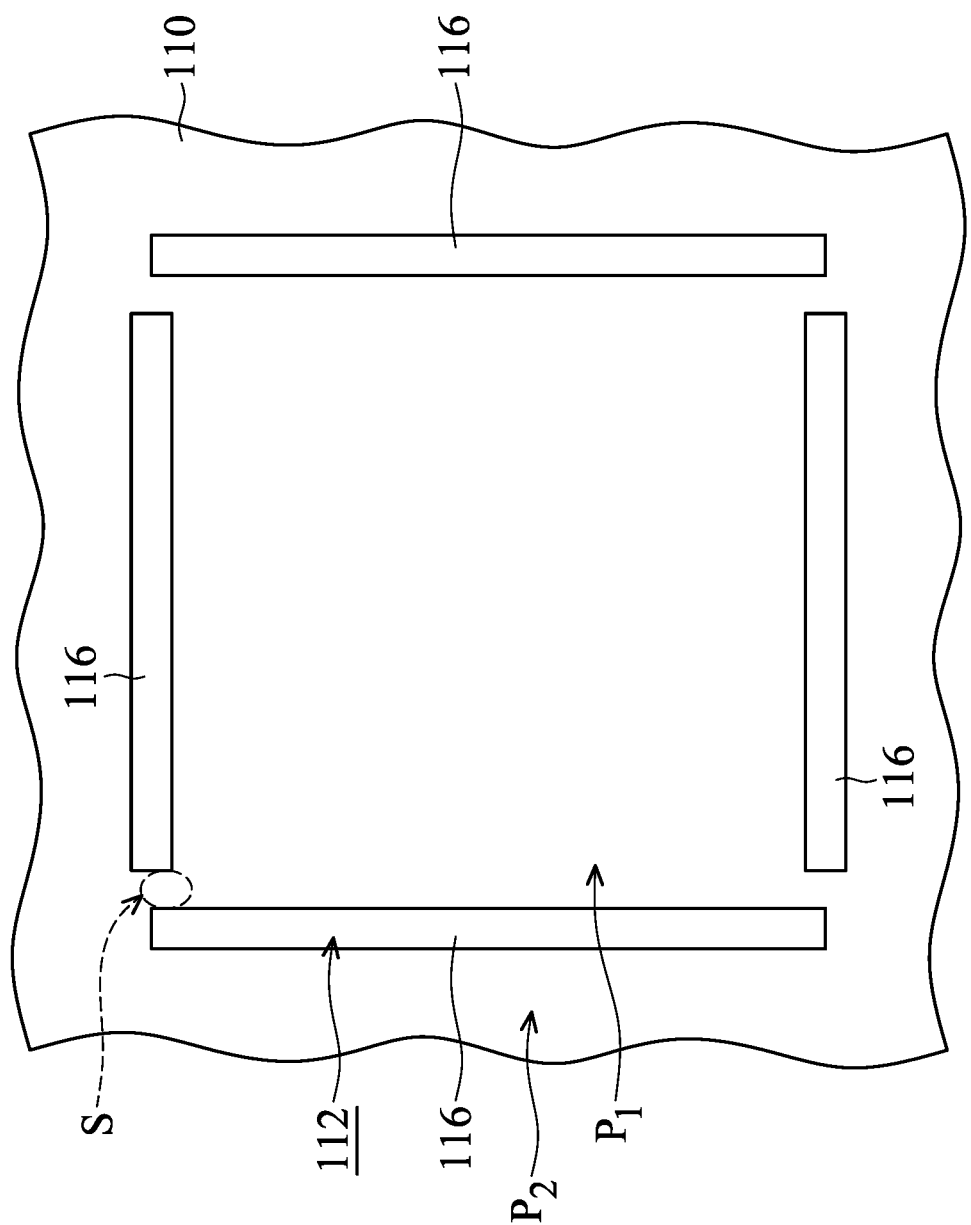
FIGS. 3A-3C are top views of various stages of a process for forming a package structure, in accordance with some embodiments.
Figure 3B:
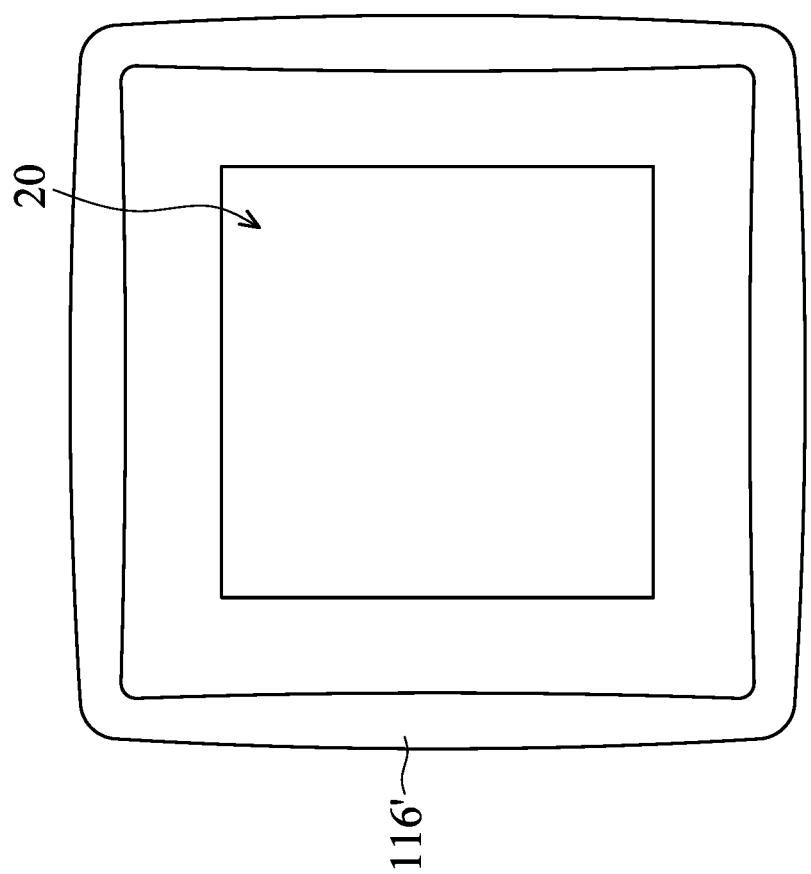
Figure 3C:
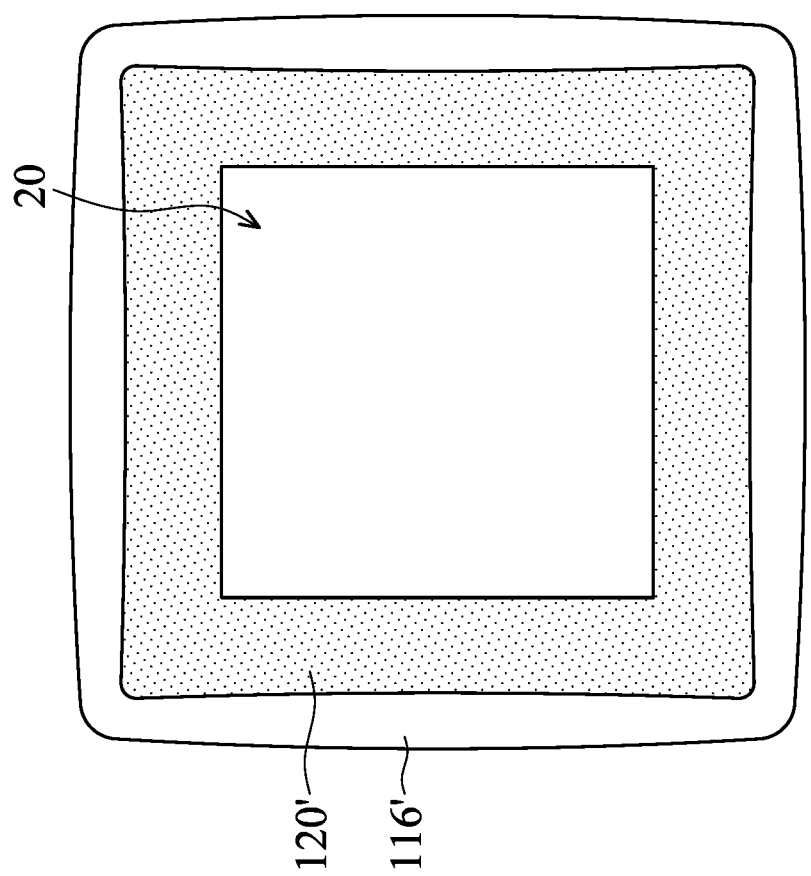

Many variations and/or modifications can be made to embodiments of the disclosure. FIGS. 3A-3C are top views of various stages of a process for forming a package structure, in accordance with some embodiments.

In some embodiments, the openings 112 of the stencil 110 are designed to be closer to each other, as shown in FIG. 3A. The support portion S of the stencil 110 is designed to be smaller. Therefore, the distance between the solder elements 116 becomes smaller accordingly.

As shown in FIG. 3B, similar to the embodiments illustrated in FIG. 2B, the solder elements 116 are reflowed to form the reflowed solder elements 116', in accordance with some embodiments. After the reflow process, the solder elements 116 may become rounded and wider. In some embodiments, two or more of the solder elements 116 originally separated from each other link together. In some embodiments, all of the solder elements 116 link together to form a reflowed solder element 116', as shown in FIG. 3B. In these cases, the reflowed solder element 116' continuously surrounds the region where the semiconductor device structure 20 is disposed.

As shown in FIG. 3C, similar to the embodiments illustrated in FIG. 2C, the cured underfill material 120' are formed within the region surrounded by the reflowed solder element 116', in accordance with some embodiments. In some embodiments, due to the confinement of the reflowed solder element 116', the cured underfill material 120' is completely located inside the region that is surrounded by the reflowed solder element 116', as shown in FIG. 3C.

Figure 4A:
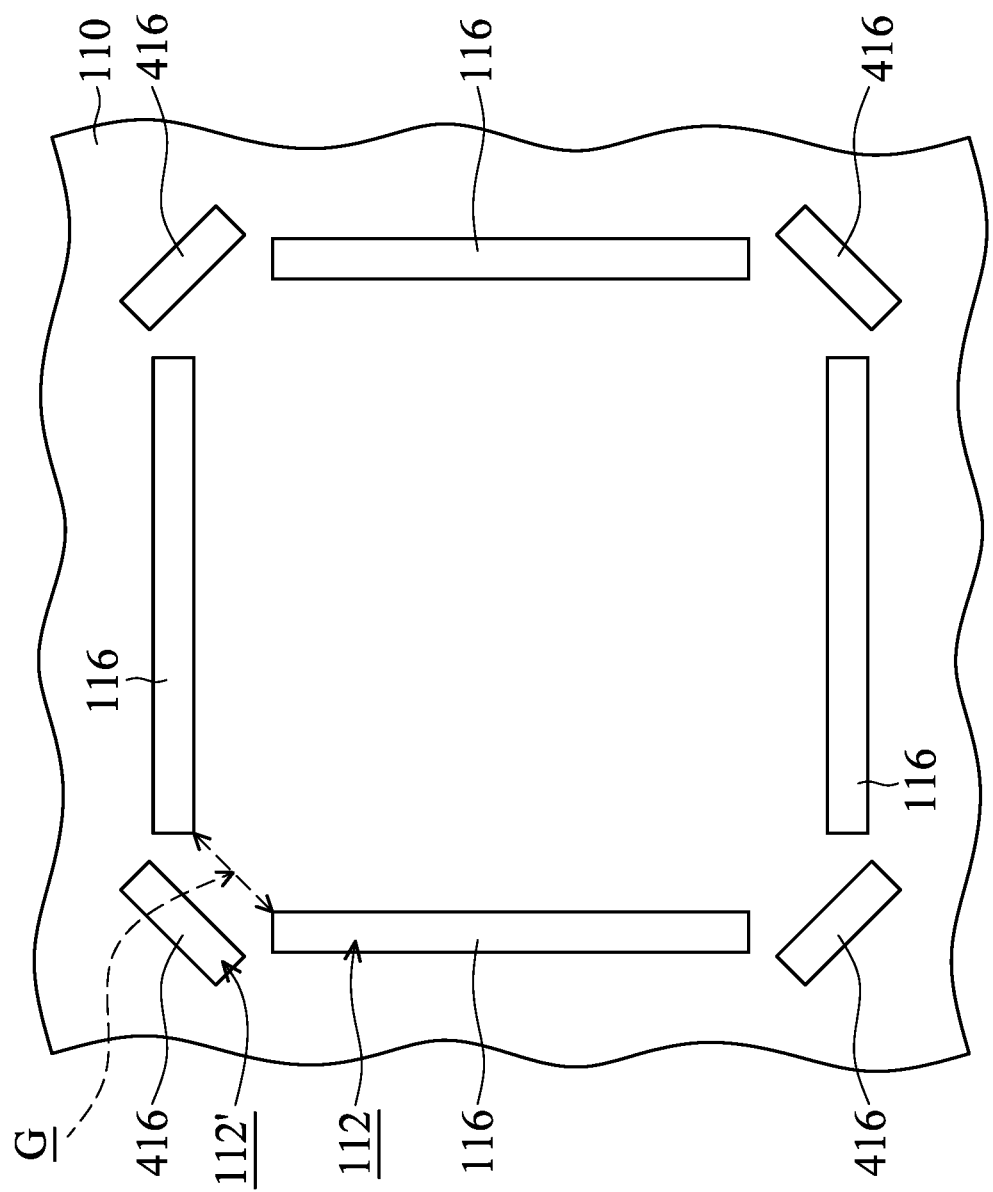
FIGS. 4A-4C are top views of various stages of a process for forming a package structure, in accordance with some embodiments.
Figure 4B:
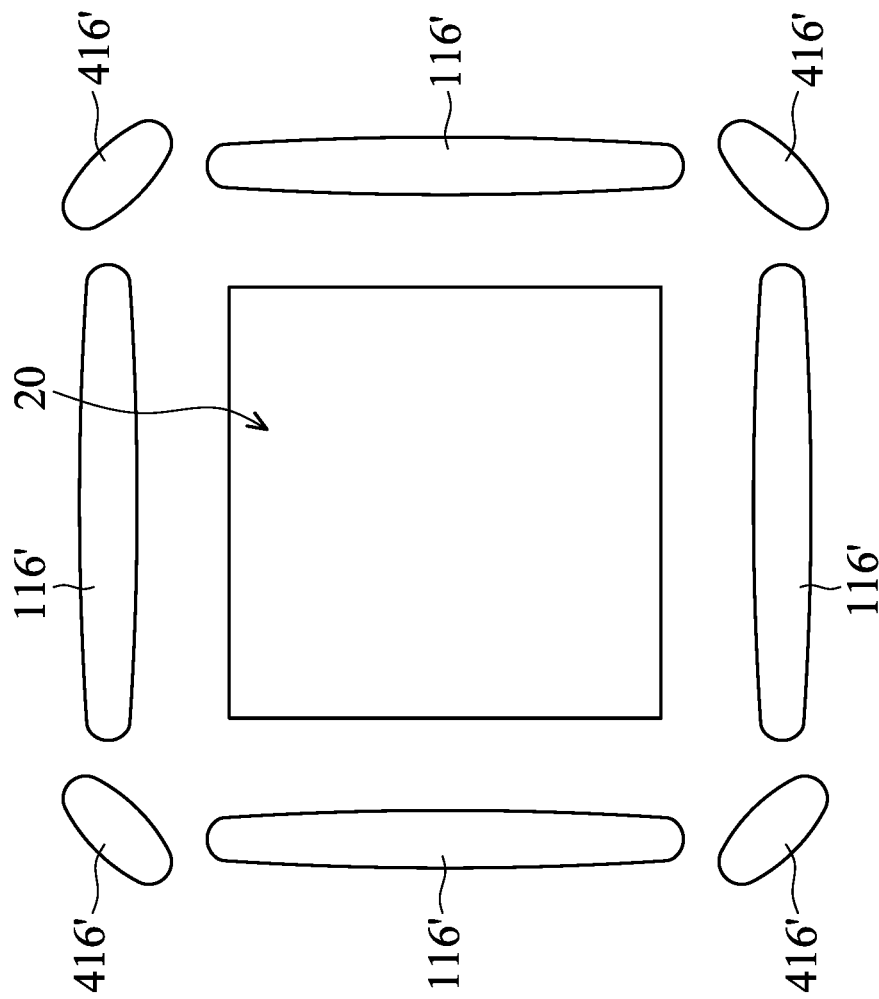
Figure 4C:
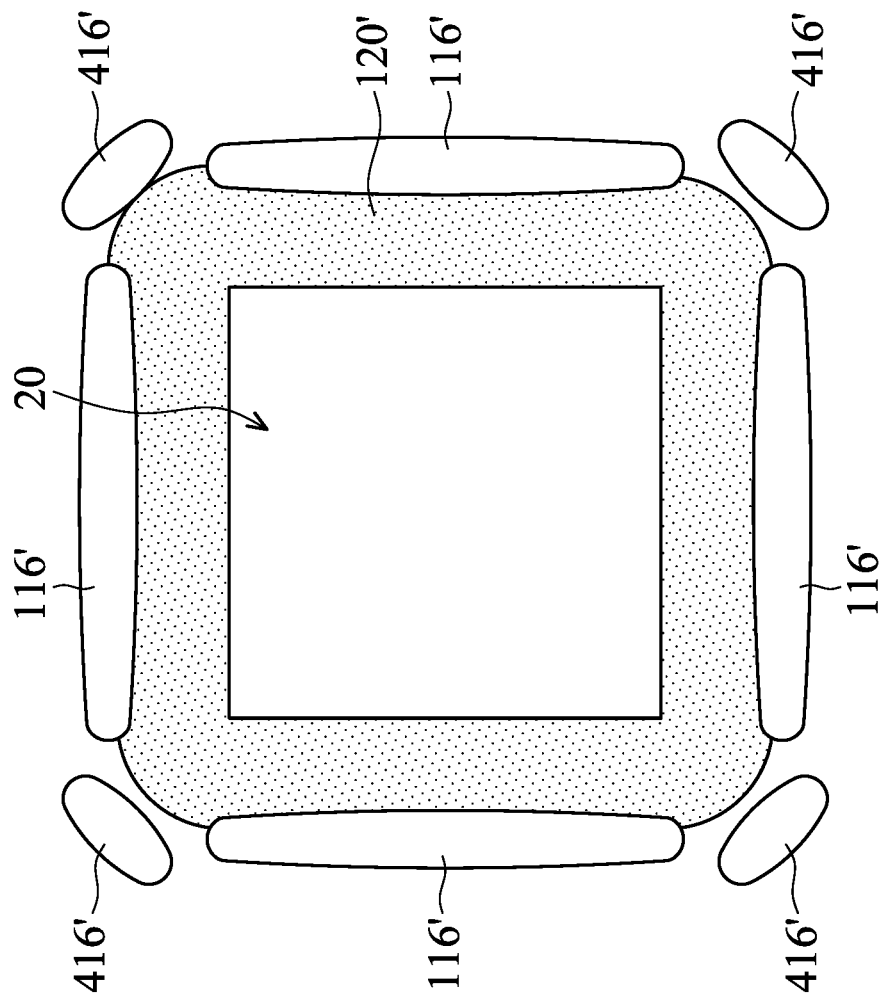

Many variations and/or modifications can be made to embodiments of the disclosure. FIGS. 4A-4C are top views of various stages of a process for forming a package structure, in accordance with some embodiments.

As shown in FIG. 4A, a structure similar to that shown in FIG. 2A is provided. In some embodiments, the stencil 110 further includes openings 112', as shown in FIG. 4A. Afterwards, a process similar to that shown in FIGS. 1B-1C is performed. As a result, first portions of the paste material 117 introduced into the openings 112 form the solder elements 116. Second portions of the paste material 117 introduced into the openings 112' form solder elements 416, as shown in FIG. 4A in accordance with some embodiments. The solder elements 116 and 416 together surround the region where a semiconductor die structure is to be disposed.

In some embodiments, one of the solder elements 416 extends across a gap G between two of the solder elements 116 that are adjacent to each other, as shown in FIG. 4A. In some embodiments, one of the solder elements 416 extends across portions of two of the solder elements 116 that are adjacent to each other, as shown in FIG. 4A.

Afterwards, similar to the embodiments illustrated in FIG. 2B, the semiconductor die structure 20 is disposed, as shown in FIG. 4B in accordance with some embodiments. Then, the reflow process is performed. As a result, reflowed solder elements 116' and 416' are formed, as shown in FIG. 4B in accordance with some embodiments.

Afterwards, similar to the embodiments illustrated in FIG. 2C, the cured underfill material 120' is formed, as shown in FIG. 4C in accordance with some embodiments. As shown in FIG. 4C, the cured underfill material 120' is substantially confined and/or blocked within the region that is surrounded by the reflowed solder elements 116' and 416', in accordance with some embodiments. The reflowed solder elements 416' that block the gap between the nearby reflowed solder elements 116' may help to further constrain the underfill material.

In some embodiments, the cured underfill material 120' is in direct contact with the reflowed solder elements 116', as shown in FIG. 4C. In some embodiments, the cured underfill material 120' is in direct contact with one of the reflowed solder elements 416', as shown in FIG. 4C. In some embodiments, one (or some) of the reflowed solder elements 416' is separated from the cured underfill material 120' without being in direct contact with the cured underfill material 120', as shown in FIG. 4C.

Many variations and/or modifications can be made to embodiments of the disclosure. In some other embodiments, each of the reflowed solder elements 416' is in direct contact with the cured underfill material 120'.

In some embodiments, the reflowed solder elements 116' are formed before the semiconductor die structure 20 is disposed over the substrate 100. However, embodiments of the disclosure are not limited thereto. Many variations and/or modifications can be made to embodiments of the disclosure. In some other embodiments, the reflowed solder elements 116' are formed after the semiconductor die structure 20 is disposed over the substrate 100.

Many variations and/or modifications can be made to embodiments of the disclosure. In some embodiments, two (or more) semiconductor die structures are disposed over the substrate 100. Two (or more) separate underfill materials may be formed to partially protect the two (or more) semiconductor die structures, respectively. In some embodiments, one or more reflowed solder elements are used to prevent two or more underfill materials from linking together. Therefore, each of the underfill materials is confined in the surrounded area. Therefore, the area of each of the underfill materials is controlled. The generated stress from the underfill materials that have controlled area is significantly reduced. The reliability of the package structure is thus improved.

Figure 5:
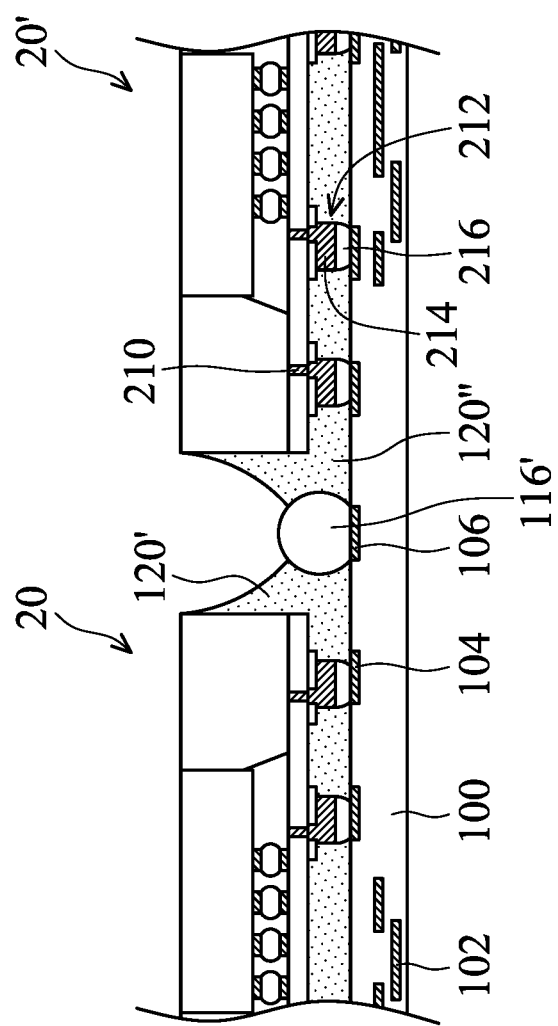
FIG. 5 is a cross-sectional view of a package structure, in accordance with some embodiments.
Figure 6:
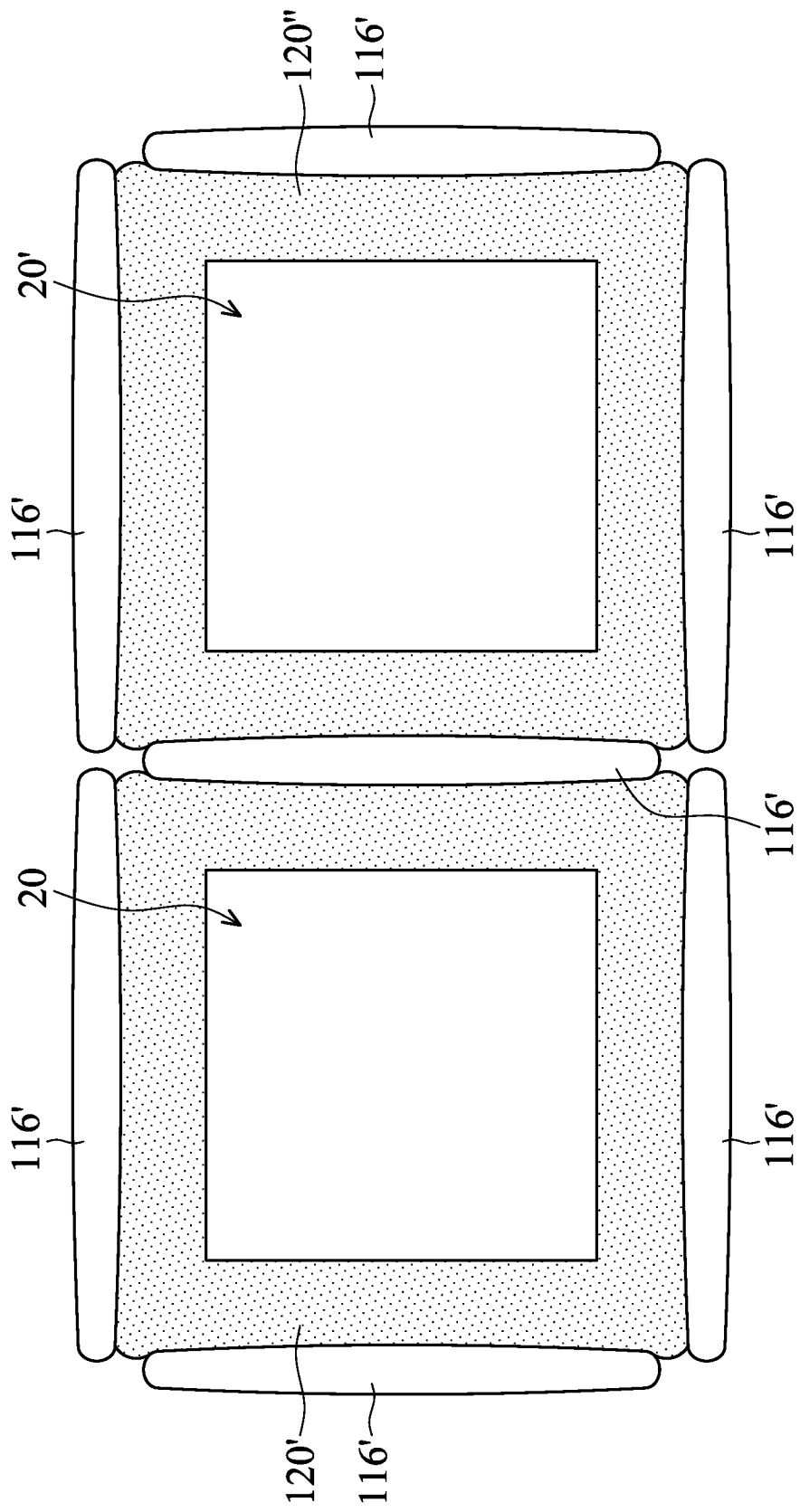
FIG. 6 is a top view of a package structure, in accordance with some embodiments.

FIG. 5 is a cross-sectional view of a package structure, in accordance with some embodiments. FIG. 6 is a top view of a package structure, in accordance with some embodiments. In some embodiments, similar to the semiconductor die structure 20, a semiconductor die structure 20' is also disposed over the substrate 100. In some embodiments, similar to the cured underfill material 120', a cured underfill material 120" is formed to surround and protect the bonding structures 212 below the semiconductor die structure 20'. In some embodiments, one of the reflowed solder elements 116' is used to confine the area of the cured underfill materials 120' and 120". The cured underfill materials 120' and 120" are prevented from linking together. The area of each of the cured underfill materials 120' and 120" is controlled. The generated stress from each of the underfill materials 120' and 120" is significantly reduced. The reliability of the package structure is thus improved.

Figure 7:
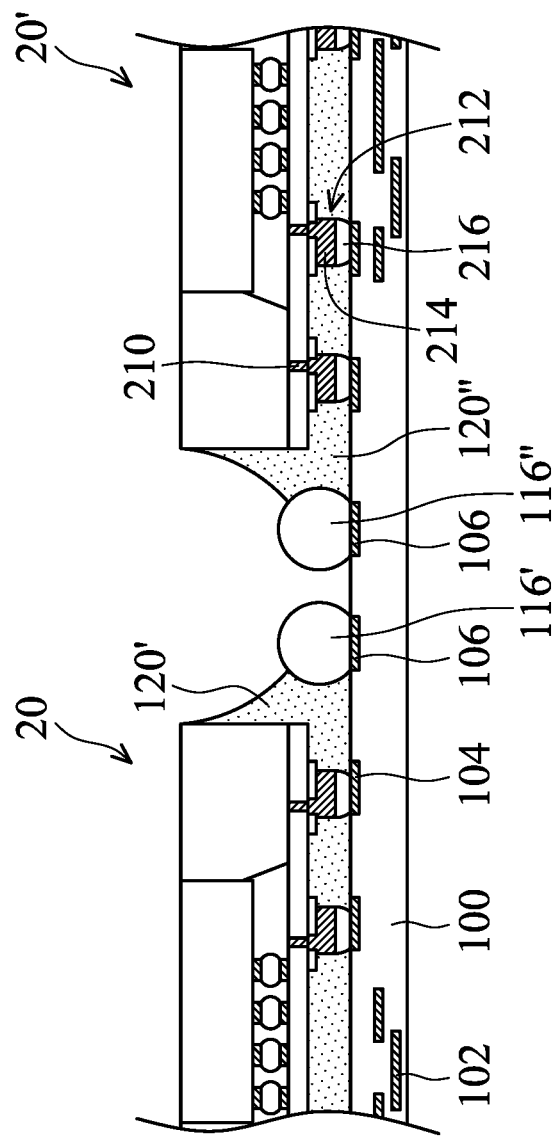
FIG. 7 is a cross-sectional view of a package structure, in accordance with some embodiments.
Figure 8:
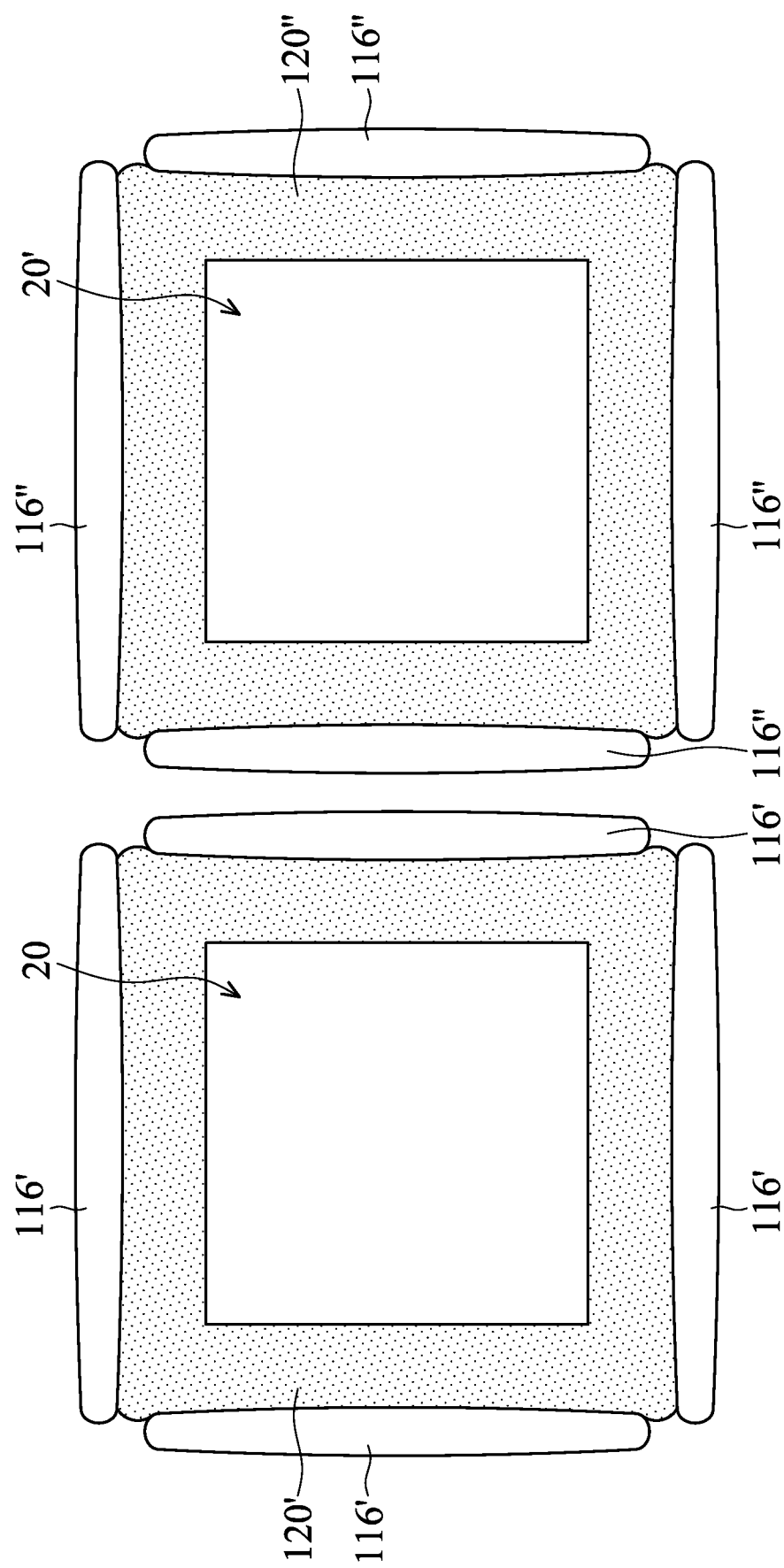
FIG. 8 is a top view of a package structure, in accordance with some embodiments.

FIG. 7 is a cross-sectional view of a package structure, in accordance with some embodiments. FIG. 8 is a top view of a package structure, in accordance with some embodiments. In some embodiments, reflowed solder elements 116' and 116" are formed to prevent the cured underfill materials 120' and 120" from linking together. The area of each of the cured underfill materials 120' and 120" is controlled. The generated stress from each of the underfill materials 120' and 120" is significantly reduced. The reliability of the package structure is thus improved.

Figure 9:
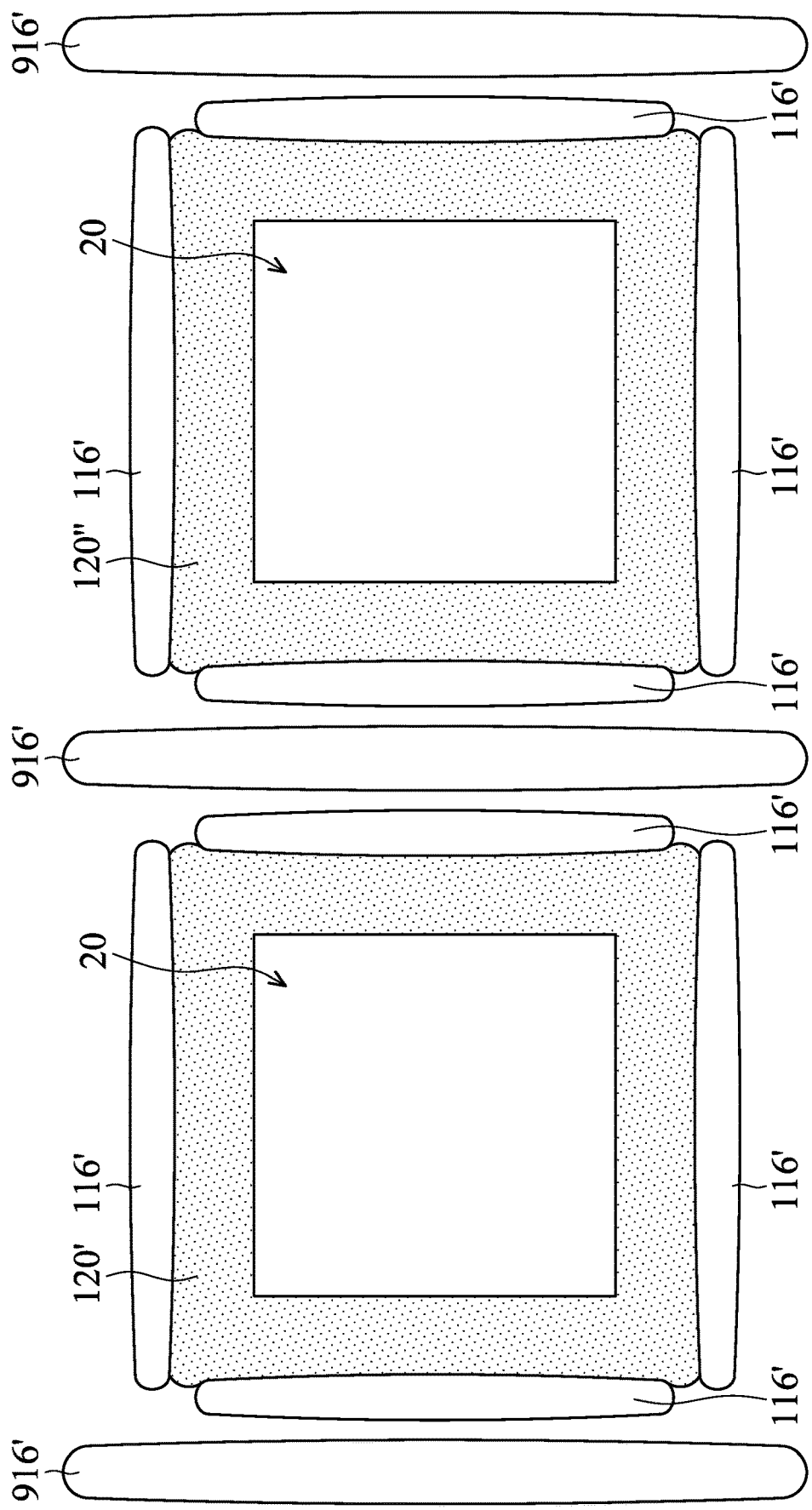
FIG. 9 is a top view of a package structure, in accordance with some embodiments.

FIG. 9 is a top view of a package structure, in accordance with some embodiments. In some embodiments, a reflowed solder element 916' is formed between the reflowed solder elements 116' and 116". Even if some of the cured underfill material 120' or 120" extends across the reflowed solder elements 116' or 116", the reflowed solder element 916' may further prevent the cured underfill materials 120' and 120" from linking together. The area of each of the cured underfill materials 120' and 120" is controlled. The generated stress from each of the underfill materials 120' and 120" is significantly reduced. The reliability of the package structure is thus improved.

Figure 10:
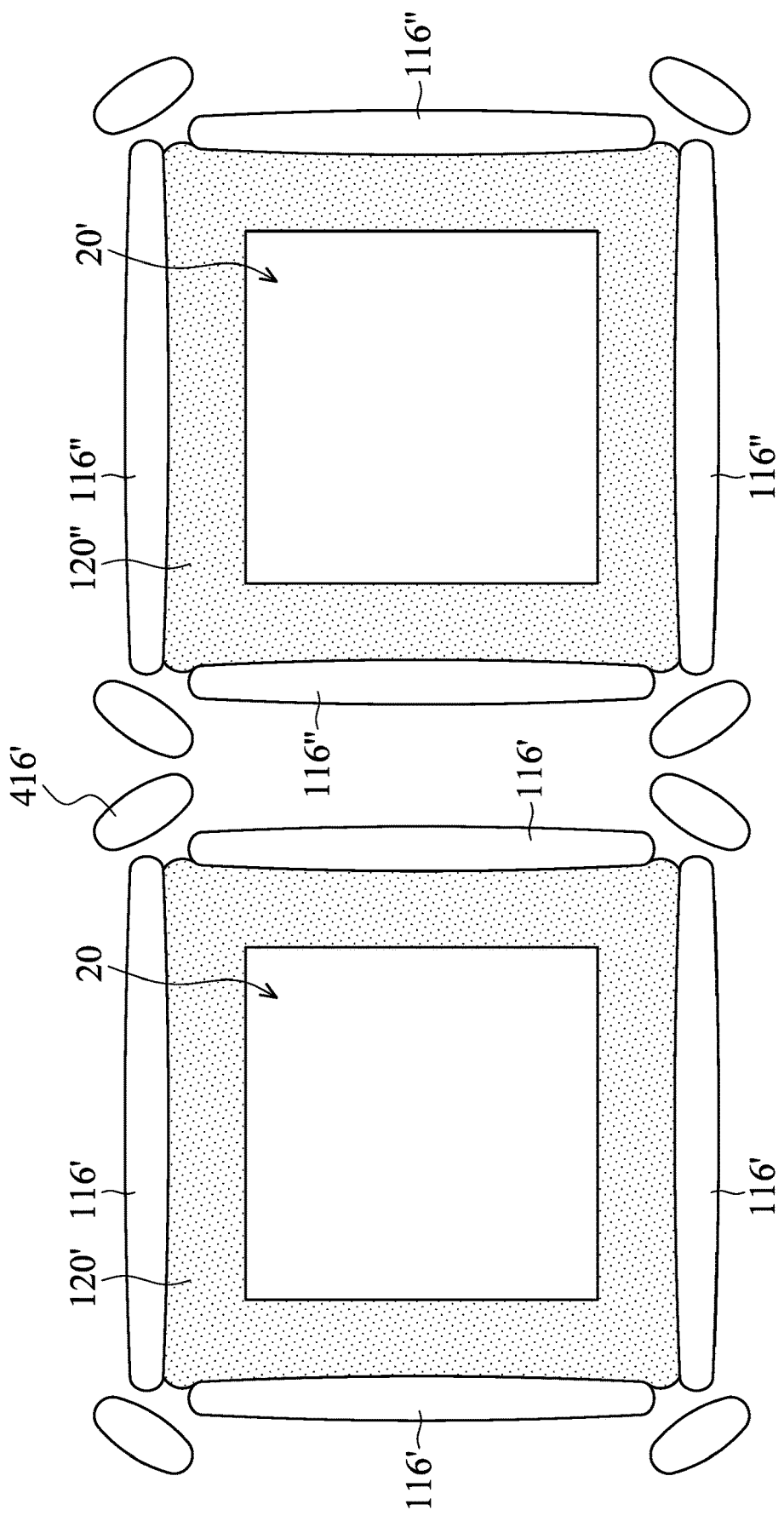
FIG. 10 is a top view of a package structure, in accordance with some embodiments.

FIG. 10 is a top view of a package structure, in accordance with some embodiments. In some embodiments, a structure that is similar to the structure shown in FIG. 8 is formed. In some embodiments, the reflowed solder elements 116' are further formed to prevent the cured underfill materials 120' and 120" from linking together. The area of each of the cured underfill materials 120' and 120" is controlled. The generated stress from each of the underfill materials 120' and 120" is significantly reduced. The reliability of the package structure is thus improved.

Embodiments of the disclosure form one or more elements (such as solder elements) over a substrate to surround a region where a semiconductor die structure is designed to be disposed. An underfill material is formed within the region to protect bonding structures between the semiconductor die structure and the substrate. Due to the confinement of the elements, the underfill material is prevented from occupying too much area of the substrate. The underfill material may also be kept away from other device elements (such as surface mounted devices) that are positioned outside of the region surrounded by the elements. The quality and reliability of the device elements may also be ensured. More device elements are allowed to be integrated onto the substrate. The performance and reliability of the package structure are significantly improved.

In accordance with some embodiments, a method for forming a package structure is provided. The method includes forming one or more solder elements over a substrate. The one or more solder elements surround a region of the substrate. The method also includes disposing a semiconductor die structure over the region of the substrate. The method further includes dispensing a polymer-containing liquid onto the region of the substrate. The one or more solder elements confine the polymer-containing liquid to being substantially inside the region. In addition, the method includes curing the polymer-containing liquid to form an underfill material.

In accordance with some embodiments, a method for forming a package structure is provided. The method includes forming multiple solder elements over a substrate, and the solder elements together surround a region of the substrate. The method also includes bonding a semiconductor die structure over the region of the substrate through bonding structures and reflowing the solder elements and the bonding structures. The method further includes introducing an underfill material onto the region surrounded by the solder elements. The solder elements substantially prevent the underfill material from flowing outside of the region. In addition, the method includes curing the underfill material.

In accordance with some embodiments, a package structure is provided. The package structure includes a semiconductor die structure over a substrate. The package structure also includes bonding structures between the semiconductor die and the substrate. The package structure further includes multiple solder elements over the substrate, and the solder elements together surround the semiconductor die structure. In addition, the package structure includes an underfill material surrounding the bonding structures. The underfill material is substantially confined within a region surrounded by the solder elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a semiconductor die structure over a substrate;
bonding structures between the semiconductor die structure and the substrate;
a plurality of solder elements over the substrate, wherein each of the solder elements contains tin and a metal material, the solder elements together surround the semiconductor die structure, and each of the solder elements is longer than a side of the semiconductor die structure;
an underfill material surrounding the bonding structures, wherein the underfill material is substantially confined within a region surrounded by the solder elements, and the underfill material is in direct contact with at least one of the solder elements;
a second semiconductor die structure over the substrate;
a plurality of second bonding structures between the second semiconductor die structure and the substrate;
a second underfill material surrounding the second bonding structure, wherein the second underfill material is separated from the underfill material by one of the solder elements; and
a second solder element between one of the solder elements and the second underfill material, wherein the second solder element is longer than each of the solder elements and extends across opposites ends of each of the solder elements.

2. The package structure as claimed in claim 1, wherein a topmost surface of one of the solder elements is vertically between the substrate and a topmost surface of the semiconductor die structure, and each of the solder elements has a rounded top.

3. The package structure as claimed in claim 1, wherein the semiconductor die structure comprises a plurality of semiconductor dies.

4. The package structure as claimed in claim 1, further comprising a third solder element, wherein the third solder element and the solder elements together surround the region, and the third solder element extends across portions of two of the solder elements that are adjacent to each other.

5. The package structure as claimed in claim 4, wherein the third solder element is shorter than the side of the semiconductor die structure.

6. The package structure as claimed in claim 5, wherein the underfill material is in direct contact with the third solder element.

7. The package structure as claimed in claim 5, wherein the underfill material is physically separated from the third solder element.

8. The package structure as claimed in claim 1, wherein the second solder element is wider than a nearby solder element of the solder elements.

9. The package structure as claimed in claim 1, further comprising:
a third solder element over the substrate, wherein the third solder element is longer than each of the solder elements and extends across opposites ends of each of the solder elements.

10. The package structure as claimed in claim 9, wherein each of the solder elements is between the second solder element and the third solder element.

11. A package structure, comprising:
a semiconductor die structure over a substrate;
bonding structures between the semiconductor die structure and the substrate;
a first solder element over the substrate and extending across opposite sides of the semiconductor die structure, wherein the first solder element is a first continuous structure and contains tin;
a second solder element over the substrate and extending across the opposite sides of the semiconductor die structure, wherein the second solder element is a second continuous structure and contains tin, and the semiconductor die structure is between the first solder element and the second solder element;
a long solder element over the substrate, wherein the long solder element is longer than each of the first solder element and the second solder element, the long solder element extends across opposites ends of the first solder element and the second solder element, and the first solder element is between the second solder element and the long solder element; and an underfill material surrounding the bonding structures, wherein the underfill material is in direct contact with at least one of the first solder element and the second solder element.

12. The package structure as claimed in claim 11, wherein the semiconductor die structure is taller than the first solder element.

13. The package structure as claimed in claim 11, wherein the semiconductor die structure has a third side substantially perpendicular to the opposite sides of the semiconductor die structure, and a long axis of the first solder element is substantially perpendicular to the third side.

14. The package structure as claimed in claim 11, further comprising:
  a second semiconductor die structure over the substrate;
  a plurality of second bonding structures between the second semiconductor die structure and the substrate; and
  a second underfill material surrounding the second bonding structure, wherein the second underfill material is separated from the underfill material by the first solder element.

15. The package structure as claimed in claim 14, wherein the first solder element extends across opposite sides of the second semiconductor die structure.

16. A package structure, comprising:
  a first semiconductor die structure and a second semiconductor die structure over a substrate;
  a plurality of first bonding structures between the first semiconductor die structure and the substrate;
  a plurality of second bonding structures between the second semiconductor die structure and the substrate;
  a plurality of first solder elements over the substrate, wherein each of the first solder elements contains tin and a metal material, the first solder elements together surround the first semiconductor die structure, and each of the first solder elements is longer than a side of the first semiconductor die structure;
  a plurality of second solder elements over the substrate, wherein the second solder elements together surround the second semiconductor die structure; and
  a long solder element between the first solder elements and the second solder elements, wherein the long solder element is longer than each of the first solder elements and the second solder elements, and the long solder element extends across opposite ends of each of the first solder elements and the second solder elements.

17. The package structure as claimed in claim 16, further comprising:
  a first underfill material surrounding the first bonding structures, wherein the first underfill material is substantially confined within a first region surrounded by the first solder elements; and
  a second underfill material surrounding the second bonding structures, wherein the second underfill material is substantially confined within a second region surrounded by the first solder elements.

18. The package structure as claimed in claim 17, wherein the first underfill material is spaced apart from the long solder element.

19. The package structure as claimed in claim 17, wherein the first underfill material is in direct contact with at least one of the first solder element, and the first underfill material is spaced apart from the second underfill material.

20. The package structure as claimed in claim 17, wherein the second underfill material is in direct contact with each of the second solder elements.

* * * * *